(12) United States Patent
Huang et al.

(10) Patent No.: US 7,338,578 B2
(45) Date of Patent: Mar. 4, 2008

(54) STEP EDGE INSERT RING FOR ETCH CHAMBER

(75) Inventors: Chih-Wei Huang, Hsinchu (TW); Shiow-Feng Changchien, Hsinchu (TW); Chia-Hung Tang, Huatan Township, Changhua County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 224 days.

(21) Appl. No.: 10/761,881

(22) Filed: Jan. 20, 2004

(65) Prior Publication Data
US 2005/0155718 A1     Jul. 21, 2005

(51) Int. Cl.
*H01L 21/00* (2006.01)
*C23C 16/00* (2006.01)
*C23C 14/00* (2006.01)

(52) U.S. Cl. ............ 156/345.51; 156/915; 156/345.52; 156/345.53; 118/715; 118/724; 118/725; 118/728

(58) Field of Classification Search ................ 156/915, 156/345.51, 345.52, 345.53; 118/724, 725, 118/728
See application file for complete search history.

(56) References Cited

U.S. PATENT DOCUMENTS

| | | | | |
|---|---|---|---|---|
| 5,529,657 A * | 6/1996 | Ishii | ...................... | 156/345.26 |
| 6,284,093 B1 * | 9/2001 | Ke et al. | ............... | 156/345.51 |
| 6,344,105 B1 * | 2/2002 | Daugherty et al. | .... | 156/345.51 |
| 6,464,794 B1 * | 10/2002 | Park et al. | .................. | 118/728 |
| 6,815,352 B1 * | 11/2004 | Tamura et al. | .............. | 438/691 |
| 2002/0029745 A1 * | 3/2002 | Nagaiwa et al. | ......... | 118/723 E |
| 2002/0059981 A1 * | 5/2002 | Hao et al. | .............. | 156/345.47 |
| 2003/0029572 A1 * | 2/2003 | Kanno et al. | .......... | 156/345.53 |
| 2003/0066484 A1 * | 4/2003 | Morikage et al. | ........ | 118/723 E |
| 2003/0106646 A1 * | 6/2003 | Ma et al. | ................ | 156/345.51 |
| 2003/0106647 A1 * | 6/2003 | Koshiishi et al. | ...... | 156/345.53 |

* cited by examiner

*Primary Examiner*—Ram N. Kackar
(74) *Attorney, Agent, or Firm*—Tung & Associates

(57) ABSTRACT

An insert ring for a wafer support inside a processing chamber for the processing, particularly dry etching, of semiconductor wafer substrates. The insert ring has a generally step-shaped cross-sectional configuration which defines a perpendicular gap or flow space between the insert ring and the wafer support. In the etching of substrates on the wafer support, the perpendicular gap or flow space defines a perpendicular flow path for plasma species. Consequently, flow of heavy plasma species against the outer wall of the wafer support is substantially hindered or reduced to reduce accumulation of polymer material on the inner surface of the insert ring and/or the outer wall of the wafer support.

20 Claims, 2 Drawing Sheets

STEP EDGE INSERT RING FOR ETCH CHAMBER

FIELD OF THE INVENTION

The present invention relates to etch chambers used to etch circuit patterns on semiconductor wafer substrates in the fabrication of integrated circuits on the substrates. More particularly, the present invention relates to a step edge insert ring that encircles an electrostatic chuck (ESC) in an etch chamber and provides a perpendicular gap space to substantially reduce polymer formation between the insert ring and the ESC, eliminating or reducing polymer peeling and B/H alarm activation between PM cycles.

BACKGROUND OF THE INVENTION

Integrated circuits are formed on a semiconductor substrate, which is typically composed of silicon. Such formation of integrated circuits involves sequentially forming or depositing multiple electrically conductive and insulative layers in or on the substrate. Etching processes may then be used to form geometric patterns in the layers or vias for electrical contact between the layers. Etching processes include "wet" etching, in which one or more chemical reagents are brought into direct contact with the substrate, and "dry" etching, such as plasma etching.

Various types of plasma etching processes are known in the art, including plasma etching, reactive ion (RI) etching and reactive ion beam etching. In each of these plasma processes, a gas is first introduced into a reaction chamber and then plasma is generated from the gas. This is accomplished by dissociation of the gas into ions, free radicals and electrons by using an RF (radio frequency) generator, which includes one or more electrodes. The electrodes are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

Referring to the schematic of FIG. 1, a conventional plasma etching system, such as an Mxp+ Super-E etcher available from Applied Materials, Inc., is generally indicated by reference numeral 10. The etching system 10 includes a reaction chamber 12 having a typically grounded chamber wall 14. An electrode, such as a planar coil electrode 16, is positioned adjacent to a dielectric plate 18 which separates the electrode 16 from the interior of the reaction chamber 12. Plasma-generating source gases are provided by a gas supply (not shown). Volatile reaction products and unreacted plasma species are removed from the reaction chamber 12 by a gas removal mechanism, such as a vacuum pump 24 through a throttle valve 26.

The dielectric plate 18 illustrated in FIG. 1 may serve multiple purposes and have multiple structural features, as is well known in the art. For example, the dielectric plate 18 may include features for introducing the source gases into the reaction chamber 12, as well as those structures associated with physically separating the electrode 16 from the interior of the chamber 12.

Electrode power such as a high voltage signal is applied to the electrode 16 to ignite and sustain a plasma in the reaction chamber 12. Ignition of a plasma in the reaction chamber 12 is accomplished primarily by electrostatic coupling of the electrode 16 with the source gases, due to the large-magnitude voltage applied to the electrode 16 and the resulting electric fields produced in the reaction chamber 12. Once ignited, the plasma is sustained by electromagnetic induction effects associated with time-varying magnetic fields produced by the alternating currents applied to the electrode 16. The plasma may become self-sustaining in the reaction chamber 12 due to the generation of energized electrons from the source gases and striking of the electrons with gas molecules to generate additional ions, free radicals and electrons. A semiconductor wafer 34 is positioned in the reaction chamber 12 and is supported by a wafer platform or ESC (electrostatic chuck) 36. The ESC 36 is typically electrically-biased to provide ion energies that are independent of the RF voltage applied to the electrode 16 and that impact the wafer 34.

Typically, the voltage varies as a function of position along the coil electrode 16, with relatively higher-amplitude voltages occurring at certain positions along the electrode 16 and relatively lower-amplitude voltages occurring at other positions along the electrode 16. A relatively large electric field strength is required to ignite plasmas in the reaction chamber 12. Accordingly, to create such an electric field it is desirable to provide the relatively higher-amplitude voltages at locations along the electrode 16 which are close to the grounded chamber wall 14.

As discussed above, plasma includes high-energy ions, free radicals and electrons which react chemically with the surface material of the semiconductor wafer to form reaction produces that leave the wafer surface, thereby etching a geometrical pattern or a via in a wafer layer. Plasma intensity depends on the type of etchant gas or gases used, as well as the etchant gas pressure and temperature and the radio frequency generated at the electrode 16. If any of these factors changes during the process, the plasma intensity may increase or decrease with respect to the plasma intensity level required for optimum etching in a particular application. Decreased plasma intensity results in decreased, and thus incomplete, etching. Increased plasma intensity, on the other hand, can cause overetching and plasma-induced damage of the wafers. Plasma-induced damage includes trapped interface charges, material defects migration into bulk materials, and contamination caused by the deposition of etch products on material surfaces. Etch damage induced by reactive plasma can alter the qualities of sensitive IC components such as Schottky diodes, the rectifying capability of which can be reduced considerably. Heavy-polymer deposition during oxide contact hole etching may cause high-contact resistance.

FIG. 2 illustrates structural details of the environment of the ESC 36 inside the reaction chamber 12. A typically silicon insert ring 40 is interposed between a shadow ring 38 and the outer circumference of the ESC 36. The insert ring 40 enhances uniformity of the etch rate among all areas on the surface of the wafer 34. A gap 46 (known in the art as a berline wall) is defined between the flat inner edge 42 of the insert ring 40 and the outer circumference of the ESC 36. The edge of the wafer 34, resting on the ESC 36, may extend over the gap 46.

As shown in FIG. 3, throughout repeated processing of successive wafers 34 on the ESC 36, a deposit of polymer material 44 tends to gradually accumulate on the outer edge of the ESC 36, and extends into the gap 46. This deposit of polymer material 44 gradually grows and closes or substantially narrows the gap 46, finally becoming deposited on the flat inner edge 42 of the insert ring 40. This renders non-uniform the leakage of cooling helium to the backside of the wafer 34 during etching, thereby energizing the B/H alarm of the etching system between PM (periodic maintenance) cycles.

Furthermore, accumulation of the polymer material 44 onto the insert ring 40 causes peeling of polymer particles from the ESC 36 and the insert ring 40. These polymer particles can potentially contaminate devices being formed on the wafers 34. Consequently, the ESC 36 and the insert ring 40 must be wet-cleaned about every 70 hours of operation of the system 10.

One of the approaches which has been taken to retard the accumulation of the polymer deposit 44 on the insert ring 40 has included widening or narrowing of the gap 46. However, this tends to increase deposition of the polymer deposit 44 on, and accelerate polymer peeling from, the insert ring 40. Furthermore, in the case of an insert ring 40 having a flat upper surface, the gap 46 provides a "straight line" path for plasma species 48 to flow between the ESC 36 and the flat inner edge 42 of the insert ring 40, as shown in FIG. 2.

It has been found that providing a stepped profile to the insert ring provides a "perpendicular flow" path for plasma species in the gap between the ESC and the edge of the insert ring. This stepped profile substantially hinders flow of the plasma species into the gap and substantially reduces the rate of polymer deposition onto the ESC sidewall.

It is therefore an object of the present invention to provide a novel insert ring for a wafer support, which insert ring prevents or minimizes the formation of polymer material thereon during processing of wafers on the support.

Another object of the present invention is to provide a novel wafer support insert ring having a stepped cross-sectional configuration to prevent or at least minimize the formation of polymer material between the ring and a wafer support or ESC that supports a wafer during an etching process.

Still another object of the present invention is to provide a novel wafer support insert ring having a stepped cross-sectional configuration to impart a perpendicular flow path of plasma species between the inner surface of the ring and a wafer support and prevent or minimize the formation of polymer material between the ring and ESC during an etching process.

Another object of the present invention is to provide a novel wafer support insert ring having a stepped cross-sectional configuration to reduce deposit of polymer material on the sidewall of a wafer support and increase utilization of an etcher.

Yet another object of the present invention is to provide a novel wafer support insert ring which prevents or minimizes the quantity of polymer material capable of accumulating in a gap between the innner surface of the insert ring and the exterior circumference of an electrostatic chuck (ESC) or other wafer support in a process chamber.

A still further object of the present invention is to provide a novel wafer support insert ring which extends the time between periodic maintenance or cleanings required for an etching chamber.

Yet another object of the present invention is to provide a novel wafer support insert ring which prevents or substantially reduces polymer peeling in a process chamber for semiconductor wafer substrates.

SUMMARY OF THE INVENTION

In accordance with these and other objects and advantages, the present invention is generally directed to a new and improved insert ring for a wafer support inside a processing chamber for the processing, particularly dry etching, of semiconductor wafer substrates. The insert ring has a generally step-shaped cross-sectional configuration which defines a perpendicular gap or flow space between the insert ring and the outer wall or surface of the wafer support. Throughout etching of multiple successive substrates on the wafer support, the perpendicular gap or flow space defines a right-angled, rather than straight-lined, flow path for plasma species. Consequently, flow of heavy plasma species against the outer wall of the wafer support is substantially hindered or reduced. This reduces accumulation of polymer material on the inner surface of the insert ring and/or the outer wall of the wafer support. Therefore, polymer peeling is eliminated or at least reduced and operational intervals for the processing chamber or system between periodic maintenance or cleanings, are prolonged.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in preventing or reducing the rate of accumulation of polymer residues on the inner surface of an insert ring and/or a wafer support in an etching chamber for the etching of circuit patterns in semiconductor wafer substrates. However, the insert ring of the present invention may be equally applicable to preventing or minimizing the accumulation of polymer materials on the insert ring and/or wafer support during the use of various other types of process chambers used in the fabrication of integrated circuits, as well as process chambers or systems used in a variety of industrial applications.

Figure 4:
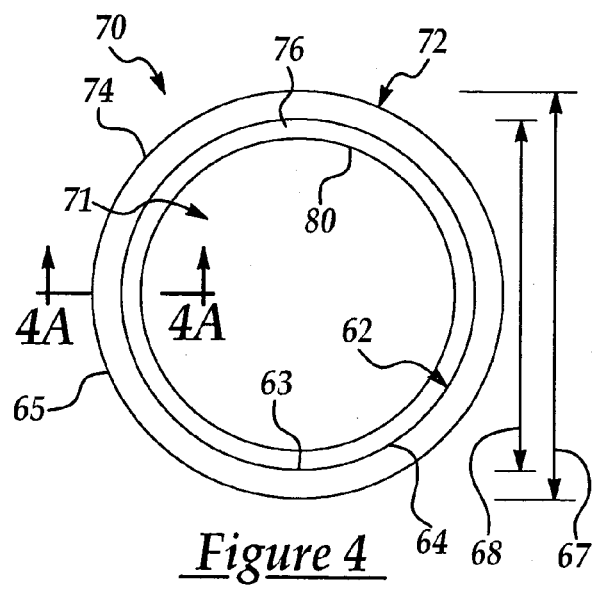
FIG. 4 is a top view of a step edge insert ring in accordance with the present invention.
Figure 4A:
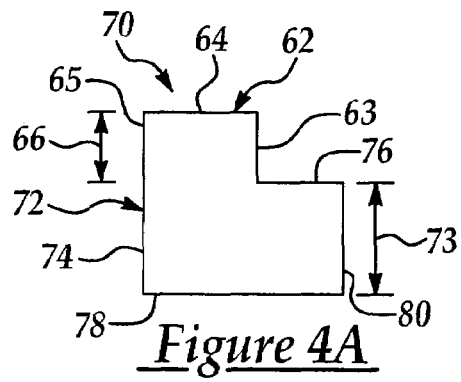
FIG. 4A is a cross-sectional view of the step edge insert ring of the present invention, taken along section lines 4A-4A in FIG. 4.

Referring initially to FIGS. 4 and 4A, a preferred embodiment of the insert ring 70 of the present invention includes an annular ring body 72. A central ring opening 71 is defined by the ring body 72, as shown in FIG. 4. The ring body 72 is typically constructed of silicon and includes an outer ring surface 74, an upper ring surface 76, a lower ring surface 78 and an inner ring surface 80. As shown in FIG. 4, the ring body 72 has a ring diameter 67 of typically about 208 mm. As shown in FIG. 4A, the ring body 72 has a ring body thickness 73 of typically about 3.5 mm.

An annular step 62 extends upwardly from the upper ring surface 76 of the ring body 72, in spaced-apart relationship to the central ring opening 71. The step 62 includes an inner step surface 63 which is generally perpendicular to the upper ring surface 76 and generally parallel to and spaced-apart from the inner ring surface 80; an upper step surface 64 which extends generally perpendicularly and outwardly from the inner step surface 63; and an outer step surface 65 which extends generally perpendicularly and downwardly from the upper step surface 64 and is continuous with the outer ring surface 74. As shown in FIG. 4, for processing of 200-mm wafers, the step 62 has an inner step diameter 68 of typically about 203 mm. As shown in FIG. 4A, the step 62 has a step thickness 66 of typically about 1.5 mm. These dimensions may vary depending on the diameter of the wafers to be processed.

Figure 1:
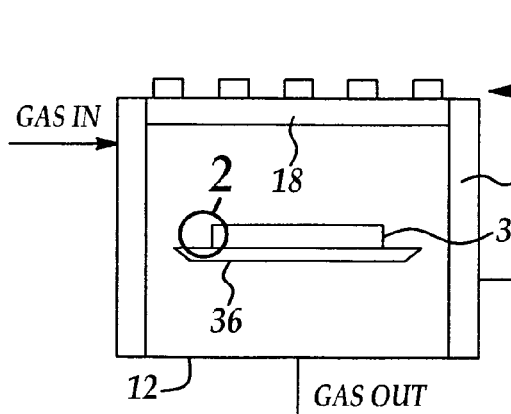
FIG. 1 is a schematic view of a typical conventional plasma etching system.
Figure 1:
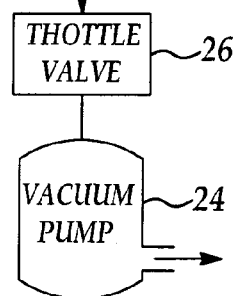
Figure 2:
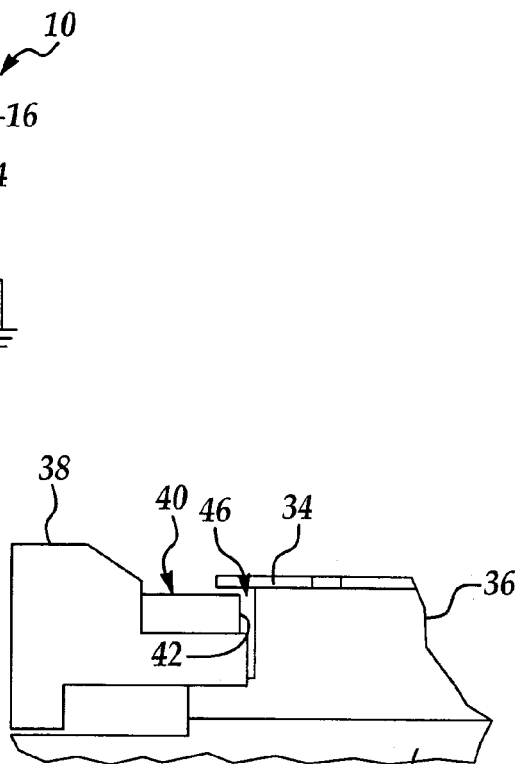
FIG. 2 is a sectional view, taken along section line 2 in FIG. 1.
Figure 3:
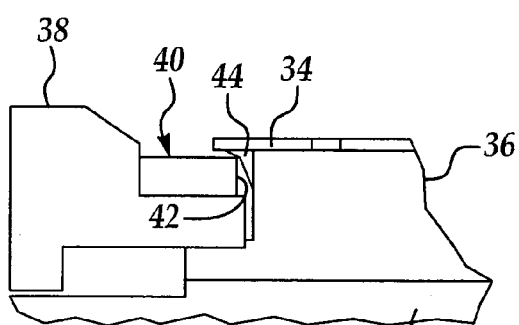
FIG. 3 is a sectional view taken along section line 2 in FIG. 1, illustrating accumulation of polymer material in a gap between the inner surface of a conventional insert ring and the outer surface of a wafer support inside a plasma etch chamber.
Figure 5:
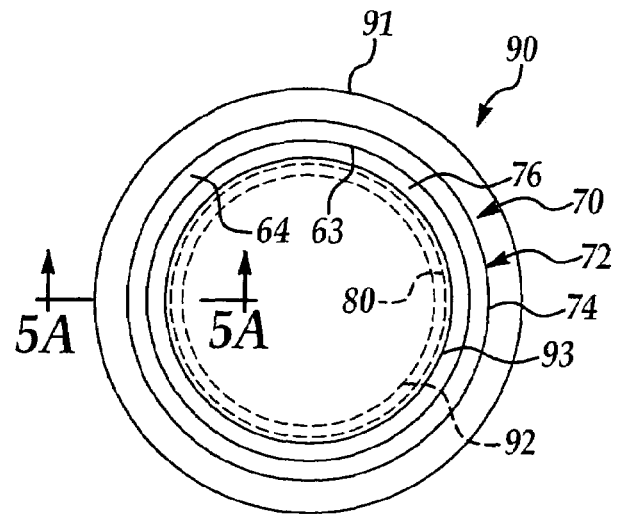
FIG. 5 is a top view of a step edge insert ring of the present invention, mounted in functional position around a wafer support, and illustrating a wafer provided on the wafer support.
Figure 5A:
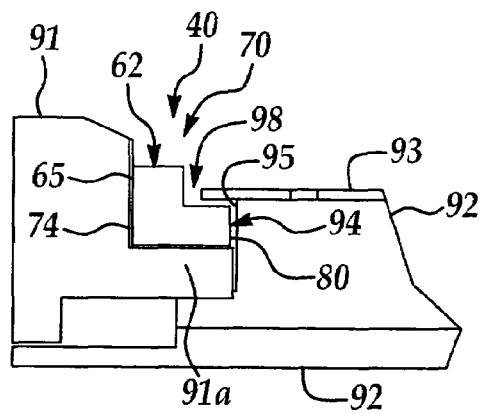
FIG. 5A is a cross-sectional view, taken along section lines 5A-5A in FIG. 5.
Figure 5B:
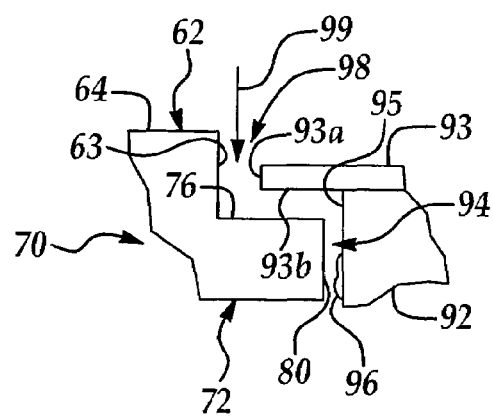
FIG. 5B is a cross-sectional view, taken along section lines 5A-5A in FIG. 5, more particularly illustrating a perpendicular flow space defined by the step edge insert ring of the present invention.

Referring next to FIGS. 5, 5A and 5B, in application the insert ring 70 of the present invention is typically used as a part of an insert ring assembly 90 in a process chamber 12 (FIG. 1), such as a Super-E etching chamber available from Applied Materials, Inc., for example. The insert ring assembly 90 includes a typically quartz shadow ring 91 that may be conventional and encircles a wafer support, such as an electrostatic chuck (ESC) 92 in the process chamber. The insert ring 70 is disposed between the shadow ring 91 and the ESC 92, and is typically supported on a flange 91a of the insert ring assembly 90, in conventional fashion as shown in FIG. 5A. Accordingly, the outer ring surface 74 of the insert ring 70 and the outer step surface 65 of the annular step 62 abut against the annular inner surface of the shadow ring 91. A gap 94 is defined between the inner ring surface 80 of the insert ring 70 and the annular outer surface 95 of the ESC 92. A semiconductor wafer 93 is supported on the ESC 92, and the wafer edge 93a (FIG. 5B) of the wafer 93 may extend over the gap 94.

As shown in FIG. 5B, a perpendicular flow space 98 is defined between the inner step surface 63 of the step 62 and the outer edge 93a of the wafer 93; between the upper ring surface 76 of the ring body 72 and the bottom surface 93b of the wafer 93; and by the gap 94 defined between the inner ring surface 80 of the ring body 72 and the outer surface 95 of the ESC 92. During the plasma etching process, plasma species 99 generated in the etching chamber generally travel in a straight-line path, as shown in FIG. 5B, and are incapable of turning in a perpendicular or 90-degree path. Accordingly, plasma species are substantially hindered from entering the gap 94. Consequently, the perpendicular flow space 98 serves as an effective barrier to the accumulation of particle residues on the inner ring surface 80 and/or the outer surface 95 of the ESC 92.

Throughout repeated use of the insert ring 70 in the etching chamber for processing of multiple successive wafers 93, some of the plasma species 99 are reflected from the inner step surface 63 of the step 62 and enter the gap 94. Consequently, polymer residues 96 are gradually deposited on the flat outer surface 95 of the ESC 92, as shown in FIG. 5B. However, due to the configuration of the perpendicular flow space 98, accumulation of the polymer residue 96 on the outer surface 95 is much more gradual than would be the case in which a straight-line flow space is defined between the insert ring 70 and the ESC 92. Consequently, polymer peeling is substantially reduced or eliminated, and normal gas flow characteristics are sustained inside the process chamber, including normal helium flow around the backside of the wafer 93, for a prolonged period of time. It has been found that use of a step edge insert ring 70, according to the present invention, is capable of extending the PM cycle intervals from 110 hours to 130 hours.

While the preferred embodiments of the invention have been described above, it will be recognized and understood that various modifications can be made in the invention and the appended claims are intended to cover all such modifications which may fall within the spirit and scope of the invention.

What is claimed is:

1. An insert ring assembly for a process chamber, comprising:
  an insert ring having a ring body defining a central ring opening and a right-angled annular step having an upper step surface provided on said ring body and spaced-apart from said central ring opening; and
  a shadow ring encircling the insert ring so that insert ring bottom rests completely on the shadow ring, an outer portion of said shadow ring extending vertically higher than said upper step surface of said insert ring, and the top of the insert ring is disposed higher than the wafer support surface.

2. The insert ring of claim 1 wherein said ring body comprises silicon.

3. The insert ring of claim 1 wherein said ring body has a ring body thickness of about 3.5 mm.

4. The insert ring of claim 3 wherein said ring body comprises silicon.

5. The insert ring of claim 1 wherein said step has a step thickness of about 1.5 mm.

6. The insert ring of claim 5 wherein said ring body has a ring body thickness of about 3.5 mm.

7. The insert ring of claim 6 wherein said ring body comprises silicon.

8. The insert ring of claim 1 wherein said process chamber comprises etching process chamber.

9. The insert ring assembly of claim 1 wherein said annular step upper step surface is vertically higher in a horizontal plane than a wafer supported on said wafer support.

10. The insert ring assembly of claim 1 further comprising an annular step lower step surface lower in a horizontal plane than an upper surface of said wafer support.

11. An insert ring assembly for a process chamber, comprising:
  a wafer support for supporting a wafer;
  an insert ring encircling said wafer support, said insert ring comprising a ring body defining a central ring opening and a right-angled annular step having an upper step surface provided on said ring body and spaced-apart from said central ring opening;
  a generally perpendicular flow space defined between said insert ring and said wafer support; and
  a shadow ring encircling the insert ring so that insert ring bottom rests completely on the shadow ring, an outer portion of said shadow ring extending vertically higher than said upper step surface of said insert ring, and the top of the insert ring is disposed higher than the wafer support surface.

12. The insert ring assembly of claim 11 wherein said ring body comprises silicon.

13. The insert ring assembly of claim 11 wherein said ring body has a ring body thickness of about 3.5 mm and said step has a step thickness of about 1.5 mm.

14. The insert ring of claim 11 wherein said process chamber comprises etching process chamber.

15. The insert ring assembly of claim 11 wherein said annular step upper step surface is vertically higher in a horizontal plane than a wafer supported on said wafer support.

16. The insert ring assembly of claim 11 further comprising an annular step lower step surface lower in a horizontal plane than an upper surface of said wafer support.

17. An insert ring assembly for a process chamber, comprising:
   a wafer support for supporting a wafer;
   an insert ring encircling said wafer support, said insert ring comprising a ring body defining a central ring opening and a right-angled annular step having a horizontal upper step surface and a horizontal lower step surface provided on said ring body and spaced-apart from said central ring opening;
   a flow space defined between said insert ring and said wafer support;
   a shadow ring encircling the insert ring so that insert ring bottom rests completely on the shadow ring, an outer portion of said shadow ring extending vertically higher than said upper step surface of said insert ring, and the top of the insert ring is disposed higher than the wafer support surface; and
   wherein said annular step horizontal lower step surface is lower in a horizonal ploane than an upper surface of said wafer support.

18. The insert ring assembly of claim 17 wherein said annular step horizontal upper step surface is vertically higher in a horizontal plane than a wafer supported on said wafer support.

19. The insert ring assembly of claim 17 wherein said step has a step thickness of about 1.5 mm.

20. The insert ring assembly of claim 17 wherein said process chamber comprises an etching process chamber.

* * * * *